(12) United States Patent
Kauffman (10) Patent No.: US 10,594,277 B2
(45) Date of Patent: *Mar. 17, 2020

(54) LOW SUPPLY CLASS AB OUTPUT AMPLIFIER

(71) Applicant: Intel IP Corporation, Santa Clara, CA (US)

(72) Inventor: John G. Kauffman, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 46 days.

This patent is subject to a terminal disclaimer.

(21) Appl. No.: 15/860,554

(22) Filed: Jan. 2, 2018

(65) Prior Publication Data

US 2018/0198426 A1     Jul. 12, 2018

Related U.S. Application Data

(63) Continuation of application No. 15/199,564, filed on Jun. 30, 2016, now Pat. No. 9,859,856.

(51) Int. Cl.
*H03F 3/24* (2006.01)
*H03F 3/45* (2006.01)
*H03F 3/30* (2006.01)
*H03F 3/195* (2006.01)
(Continued)

(52) U.S. Cl.
CPC ............ *H03F 3/245* (2013.01); *H03F 3/195* (2013.01); *H03F 3/3022* (2013.01); *H03F 3/45183* (2013.01); *H03F 3/45273* (2013.01); *H04B 1/0475* (2013.01); *H03F 2200/294* (2013.01); *H03F 2200/451* (2013.01); *H03F 2200/456* (2013.01); *H03F 2200/462* (2013.01);
(Continued)

(58) Field of Classification Search
CPC ............ H03F 3/45; H03F 2203/45091; H03F 2200/451; H03F 3/303; H03K 19/017563
See application file for complete search history.

(56) References Cited

U.S. PATENT DOCUMENTS 5,361,041 A * 11/1994 Lish ..................... H03F 3/3001
                                                         330/255
8,400,343 B1 *  3/2013 Lin ......................... H03M 1/14
                                                         341/118

(Continued)

OTHER PUBLICATIONS

International Preliminary Report on Patentability from PCT/US2017/028993 dated Jan. 10, 2019, 11 pgs.

(Continued)

*Primary Examiner* — Rahel Guarino
(74) *Attorney, Agent, or Firm* — Green, Howard, & Mughal LLP (57) ABSTRACT

An apparatus is provided which comprises: a differential input amplifying stage including a current source and a first node; a first matched pair of transistors coupled to the first node, wherein one of the transistors of the first matched pair is coupled to an output node of a driving stage; a second matched pair of transistors coupled to a second node to bias the second matched pair of transistors, wherein one of the transistors of the second matched pair of transistors is coupled to the output node of the driving stage, and wherein the second node is to be charged according to a first bias of the current source; and a resistive device coupled to the first and second nodes.

18 Claims, 7 Drawing Sheets

(51) Int. Cl.
*H04B 1/04* (2006.01)
*H04B 7/0413* (2017.01)

(52) U.S. Cl.
CPC ...... *H03F 2200/555* (2013.01); *H04B 7/0413* (2013.01); *H04B 2001/045* (2013.01)

(56) References Cited

U.S. PATENT DOCUMENTS

| | | | |
|---|---|---|---|
| 8,536,947 B2* | 9/2013 | Wang | H03F 3/45183 |
| | | | 330/255 |
| 9,065,477 B2* | 6/2015 | Rajasekhar | H03M 1/0678 |
| 9,093,962 B2* | 7/2015 | Barbieri | H03F 1/0261 |
| 9,859,856 B1* | 1/2018 | Kauffman | H03F 3/195 |
| 2002/0008550 A1 | 1/2002 | Sim et al. | |
| 2006/0170458 A1 | 8/2006 | Lee et al. | |
| 2006/0202762 A1 | 9/2006 | Detlef | |
| 2007/0170993 A1 | 7/2007 | Zhang et al. | |
| 2010/0156532 A1 | 6/2010 | Wang et al. | |
| 2013/0036147 A1* | 2/2013 | Yan | H03H 15/00 |
| | | | 708/300 |
| 2015/0102949 A1* | 4/2015 | Rajasekhar | H03M 1/08 |
| | | | 341/118 |

OTHER PUBLICATIONS

Ex Parte Quayle Office Action dated Mar. 29, 2017 for U.S. Appl. No. 15/199,564.
International Search Report & Written Opinion dated Jul. 19, 2017 for PCT Patent Application No. PCT/US17/28993.
Notice of Allowance from U.S. Appl. No. 15/860,554 dated Sep. 5, 2017, 9 pgs.
De Langen, Klaas-Jan, "Compact Low-Voltage Power-Efficient Operational Amplifier Cells for VLSI", IEEE Journal of Solid-State Circuits, vol. 33, No. 10, Oct. 1998, pp. 1482-1496 (15 pages).
Hogervorst, R. et al., "A Compact Power-Efficient 3 V CMOS Rail-To-Rail Input/Output Operational Amplifier for VLSI Cell Libraries", IEEE Journal of Solid-State Circuits, vol. 29, No. 12, Dec. 1994, pp. 1505-1513 (9 pages).
You, F. et al., "Low-Voltage Class AB Buffers With Quiescent Current Control", IEEE Journal of Solid-State Circuits, vol. 33, No. 6, Jun. 1998, pp. 915-920 (6 pages).

* cited by examiner

LOW SUPPLY CLASS AB OUTPUT AMPLIFIER

CLAIM OF PRIORITY

This United States patent application is a continuation of, and claims priority to, U.S. patent application Ser. No. 15/199,564 entitled "LOW SUPPLY CLASS AB OUTPUT AMPLIFIER," filed Jun. 30, 2016, the entire contents of which are incorporated herein by reference.

BACKGROUND

Power amplifier circuits are classified as classes A, B, AB and/or C for analog designs. An amplifier with Class A output includes an active element that remains conducting all the time, and so 100% of an input signal is used. Conversely, an amplifier with Class B output includes an active element that carries current half of each cycle of the input signal, and is turned off the other half of the input signal, and so 50% of the input signal is used. Amplifiers with Class AB output have at least two active elements that conduct more than half of the time. As such, Class AB is an intermediate between Class A and Class B. As technology nodes scale to smaller sizes, the power supply VDD continues to drop which makes it harder to design high speed, low VDD, and low power, operational amplifiers with a Class AB output.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe a Class AB output amplifier with class AB biasing which results in a high speed, high linearity operational amplifier that can operate at low VDD supply voltages. In some embodiments, the Class AB output amplifier includes a current sensing loop which is used to regulate an output quiescent current of both n-type sides of a differential input amplifier while a resistor is used to level-shift an AC (Alternating Current) signal from the output of the first stage amplifier (e.g., differential input stage). In some embodiments, the Class AB output amplifier includes p-type output stages having quiescent currents that are regulated by a common mode feedback loop (CMFL) with additional flip current sources added to a bottom of each level shifting resistor. As such, the class AB battery voltage flips polarity to further allow the VDD supply to lower. Other technical effects will be evident from the description of the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% (unless otherwise specified) of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

Figure 1:
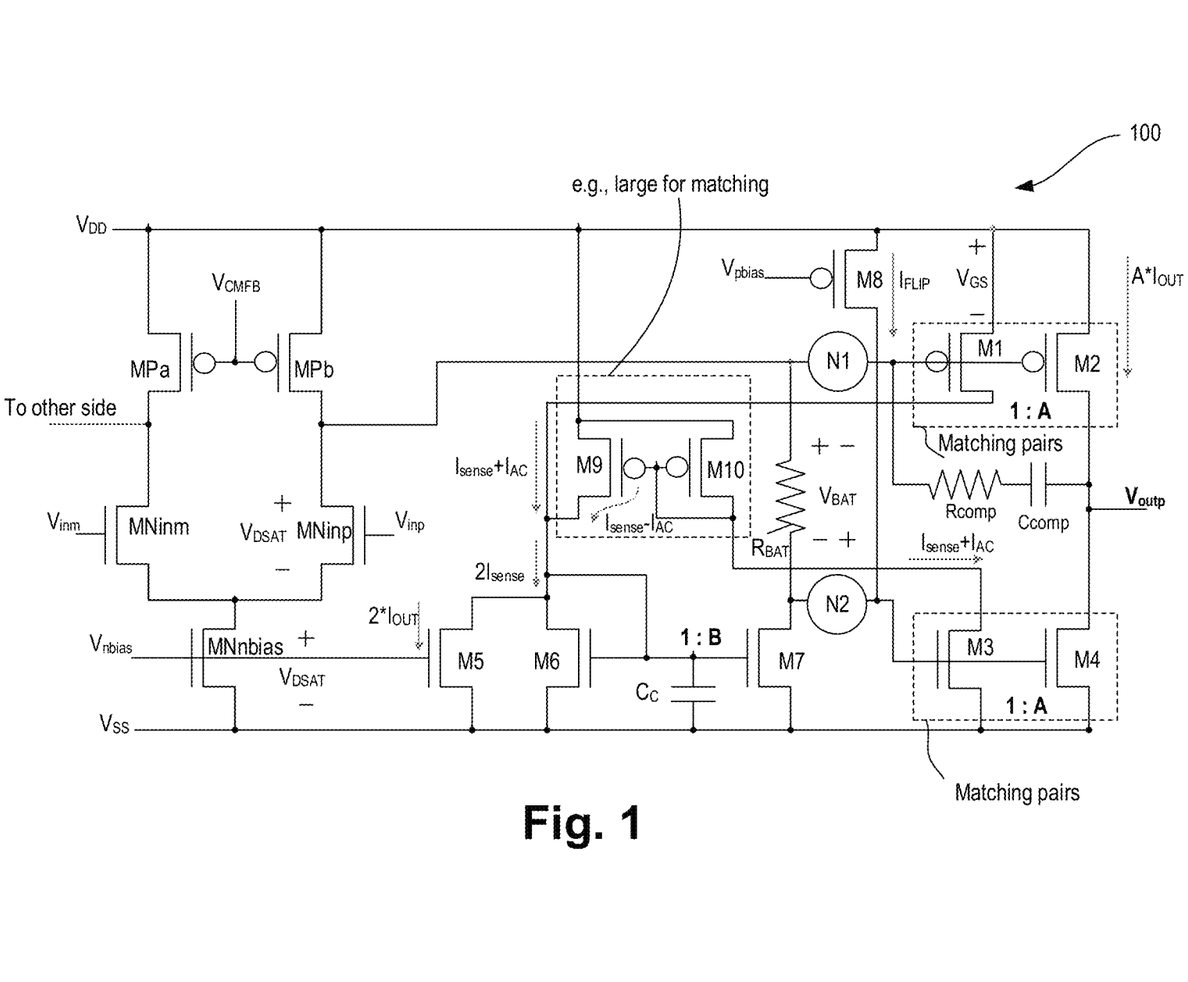
FIG. 1 illustrates a low voltage Class AB output single-side sensing amplifier, according to some embodiments of the disclosure.

FIG. 1 illustrates a low voltage Class AB output single-side sensing amplifier 100, according to some embodiments of the disclosure. In some embodiments, amplifier 100 comprises a differential input stage having n-type transistors MNinm, MNinp, MNnbias, and p-type transistors MPa and MNb coupled together as shown. The transistors MPa and MPb are biased by a first bias voltage (e.g., $V_{CMFB}$, a common mode feedback signal). Transistor MNnbias forms a current source which is biased by a second bias voltage $V_{nbias}$. While FIG. 1 illustrates a single-side sensing stage, the complete amplifier is a differential amplifier with one side shown in FIG. 1. The $V_{CMFB}$ is used because the complete amplifier is a differential amplifier with only one side drawn. Thus each side would have an individual loop. Each loop may have a different offset, thus there would be larger variation between the positive side output current and the negative side output current. The $V_{CMFB}$ uses an amplifier sensing both outputs (of both single-side sections) and regulating the common mode.

So as not to obscure the embodiments, the bias generators for $V_{nbias}$ and $V_{pbias}$ are not shown, any suitable bias generator may be used for that purpose. N-type transistors MNinm and MNinp are the differential input transistors that receive input voltages $V_{inm}$ and $V_{imp}$, respectively. Here, node N1 (shown as a large circle) is the output of the differential input stage. Throughout the disclosure, node names and signal names are interchangeably used. For example, $V_{DD}$ may refer to supply node $V_{DD}$ or the power supply $V_{DD}$ provided on that node depending on the context of the sentence.

In some embodiments, the output driving stage of amplifier 100 comprises p-type transistors M1 and M2, and n-type transistors M3 and M4, where transistor M2 is coupled in series with transistor M4 via a common node $V_{outp}$, and where $V_{outp}$ is the output terminal of amplifier 100. As discussed above, the complete apparatus includes another single-side stage (to form a differential stage), and that single-side stage provides the other output, $V_{outm}$ (shown in FIG. 3). Referring back to FIG. 1, in some embodiments, transistors M1 and M2 are matched pair that are ratioed for current multiplication (e.g., 1:A, where 'A' is a multiplying factor greater than 1).

Here, the term "match" is a term of art which generally refers to layout similarity between the drawn layouts of two devices. When the layouts of two devices are matched, they have either the exact same drawn layout in every aspect or ratio in layout. In some cases, matching over process variations is also achieved by placing the device to be matched in the middle of a larger sized transistor. For example, a first device of a first layout may be ten times smaller in dimension (width and/or length) than a second device of a second layout, where the first device is matched with the second device in a 1:10 ratio.

In some embodiments, transistors M3 and M4 are matched pair that are ratioed for current multiplication (e.g., 1:A, where 'A' is a multiplying factor greater than 1). In some embodiments, the gate terminals of transistors M1 and M2 are coupled to node N2 (shown as a large circle). In some embodiments, the gate terminals of the transistors M3 and M4 are coupled to node N1 (also shown as a large circle). In some embodiments, the source terminals of transistors M3 and M4 are coupled to ground ($V_{SS}$). In some embodiments, the source terminals of transistors M1 and M2 are coupled to supply ($V_{DD}$).

In some embodiments, p-type transistor M8 is provided which is biased by $V_{pbias}$ (separate from $V_{nbias}$). Any known bias generator may be used for generating the bias signal $V_{pbias}$. In some embodiments, the p-type transistor M8 has a source terminal coupled to $V_{DD}$ and a drain terminal coupled to node N2. In some embodiments, a pair of compensation capacitor Ccomp and resistor Rcomp (which are coupled together in series) are coupled to the output node $V_{outp}$ and node N1. The capacitor Ccomp and resistor Rcomp can be implemented in any suitable manner. For example, capacitor Ccomp can be implemented as transistor based capacitor, a metal capacitor, or a combination of metal capacitor and transistor based capacitor. Resistor Rcomp can also be implemented as a transistor (e.g., a transistor operating in a linear region), a metal or poly resistor, or a combination of transistor and metal/poly resistor. In some embodiments, capacitor Ccomp and resistor Rcomp are connected to node N2 instead of node N1. In some embodiments, capacitor Ccomp and resistor Rcomp are split by a fraction such that one fraction (e.g., 50%) of Ccomp and Rcomp are coupled to node N1 and another fraction (e.g., 50%) of Ccomp and Rcomp are coupled to node N2

In some embodiments, a resistive device $R_{BAT}$ is provided which is coupled to nodes N1 and N2. Resistive device $R_{BAT}$ can be implemented in any suitable manner. For example, resistive device $R_{BAT}$ can be formed as a transistor (e.g., a transistor operating in a linear region), a metal or poly resistor, or a combination of transistor and metal/poly resistor. In some embodiments, a current sensing stage is provided comprising a current mirror. In some embodiments, the current sensing stage comprises n-type transistors M5, M6, and M7, and p-type transistors M9 and M10 coupled together as shown. In some embodiments, compensation capacitor $C_c$ is coupled to the current mirror and ground ($V_{SS}$).

In some embodiments, the current mirror comprises diode connected transistor M6 coupled to transistor M7, where the size of transistor M7 is 'B' times larger than the size of transistor M6 (e.g., ratio of 1:B). As such, the current through transistor M7 can be 'B' times larger than current through transistor M6. In some embodiments, the gain of B produces a gain within the feedback system to make the output current more accurate. By having this gain B within the current mirror, the current through transistor M6 becomes almost zero since the transistor M5 takes the $2I_{sense}$ current which sets the output current $I_{OUT}$. In some embodiments, transistor M10 is diode-connected and is coupled to transistor M9. In some embodiments, transistors M9 and M10 are matched transistors. In some embodiments, when transistors are made large in size, they are easier to match and show less systematic variation in their parameters (e.g., threshold voltage, size, etc.). Larger sized transistors in the current mirror assist with setting the output current accurately. In some cases, when the transistors of the current mirror are not large, an error is produced in the output current $I_{OUT}$.

In some embodiments, the source terminals of transistors M9 and M10 are coupled to $V_{DD}$. In some embodiments, the drain terminal of transistor M9 coupled to diode-connected transistor M6 and transistor M5. In some embodiments, the drain terminal of transistor M10 is coupled to the drain terminal of transistor M3. In some embodiments, the drain terminal of transistor M7 is coupled to node N2 and resistor $R_{BAT}$. In some embodiments, p-type transistor M8 (biased by $V_{pbias}$) is coupled to node N2 and power supply $V_{DD}$.

In some embodiments, the worst case headroom requirements of amplifier 100 is one $V_{GS}$ and two $V_{DSAT}$ (note a single-side of a differential amplifier is drawn, "To other side" indicates the negative side producing $V_{outm}$ output). In some embodiments, the quiescent current $I_{OUT}+I_{AC}$ is sensed by matching p-type transistor pairs M1 and M2. Here, the sense current $I_{sense}$ is $(I_{OUT}+I_{AC})/A$. In some embodiments, the n-type transistor pairs M3 and M4 with the sense current inverted by the current mirror (e.g., transistors M9 and M10) and added into the input (e.g., drain/gate terminal of transistor M6) of a current amplifier provide current $2I_{sense}$.

Figure 2:
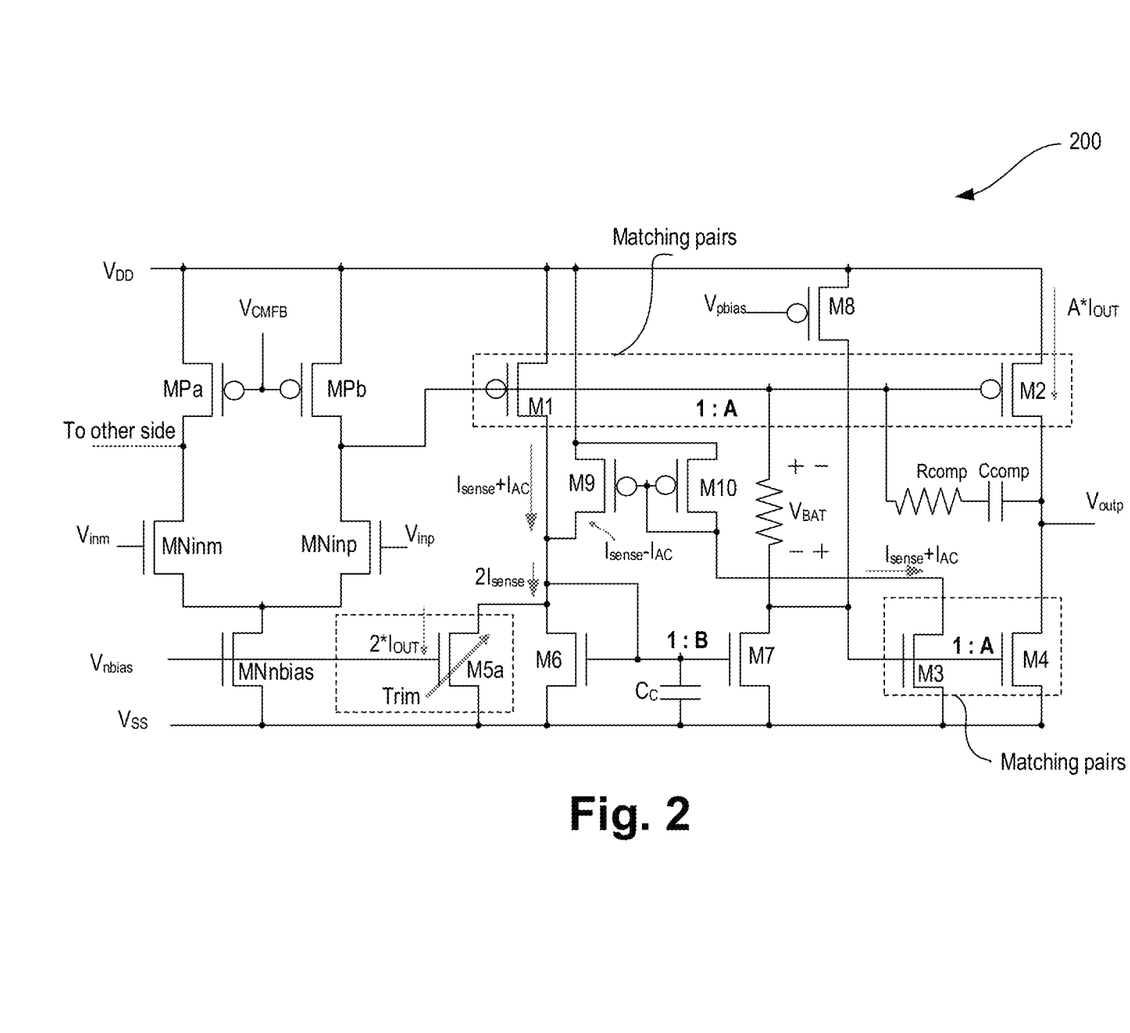
FIG. 2 illustrates a low voltage Class AB output single-side sensing amplifier with trim-able current sensing, according to some embodiments of the disclosure.
Figure 3:
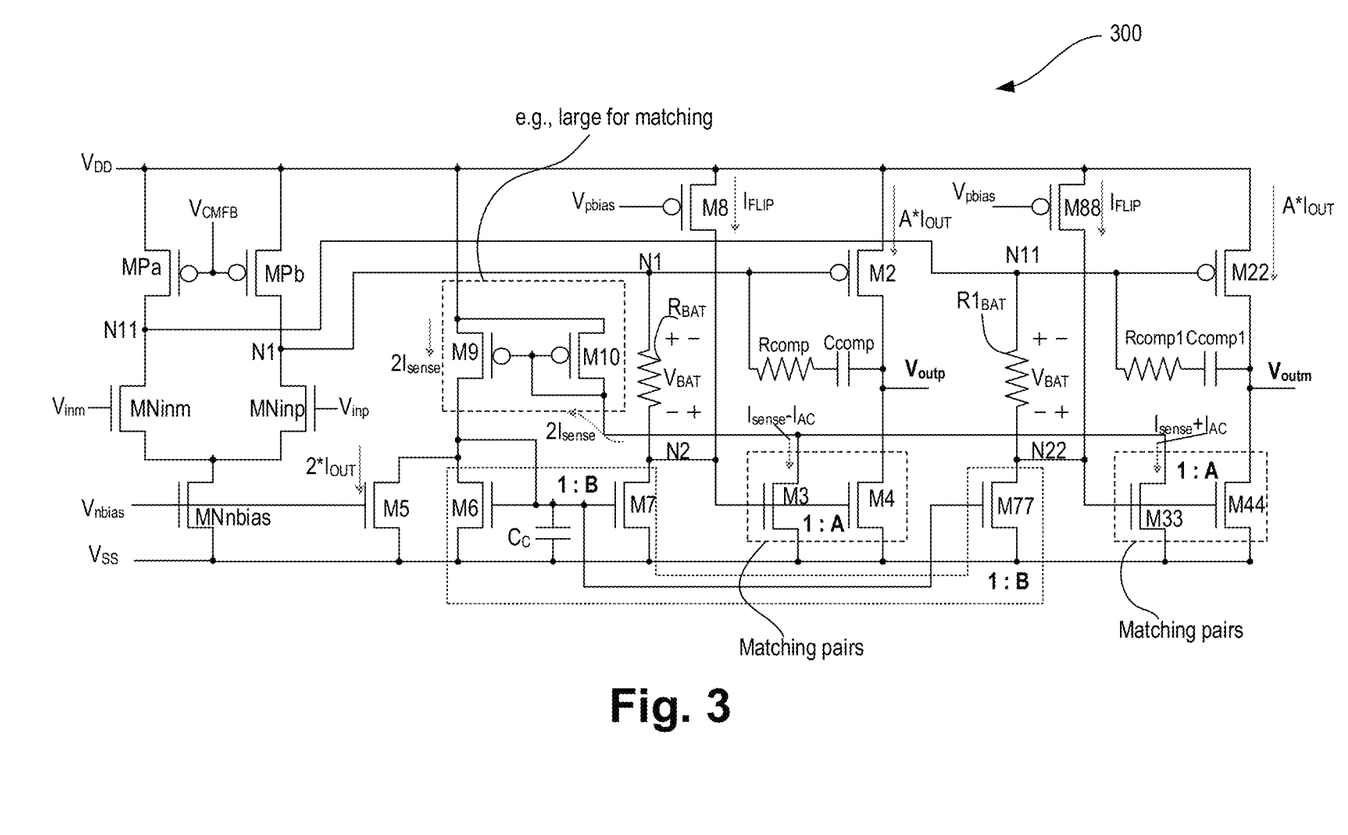
FIG. 3 illustrates a low voltage Class AB output differential amplifier, according to some embodiments of the disclosure.

Note this inverting current mirror can be sized large for good matching, and long 'L' for decreased channel length modulation while not loading down any critical paths within the amplifier high speed signal path, in accordance with some embodiments. Here, the combining of p-type and n-type sense sides is referred to as single-side sensing of a differential amplifier structure. The other single-side sensing, which when combined with the single-side sensing of amplifier 100, forms a differential Class AB output amplifier as shown in FIG. 3. By combining both single-sided stages, a differential-side sensing is achieved which is more accurate since there is merely one sensing loop. (Note, FIGS. 1, 2, and 3 are all portions of or complete illustrations of differential input/output amplifiers).

Referring back to FIG. 1, in some embodiments, current sensing stage (or amplifier) is used with a gain of 'B' which amplifies the error current in transistor M6. The error current is the delta (or difference) between the desired $2I_{OUT}$ set in transistor M5 and the $2I_{sense}$ current measured from transistors M1 and M3. In some embodiments, transistor M7 delivers the regulation current to bias up properly the output stages comprising transistors M2 and M4 with a voltage drop across resistor $R_{BAT}$. The class AB action is then achieved by $V_{BAT}$ (voltage across resistor $R_{BAT}$) and the AC signal from the differential input stage is then level-shifted from nodes N1 to N2 across $R_{BAT}$.

In some embodiments, when the output gate source voltage $V_{GSN}$ of the n-type transistor (e.g., transistor M4) is smaller than $V_{DD}$ minus the output gate source voltage of the p-type transistor (e.g., transistor M2), a positive $V_{BAT}$ is produced across resistive device $R_{BAT}$. For example, when $V_{GSN}<(V_{DD}-V_{SGP})$, voltage across node N1 to node N2 is positive. As such, the regulation loop has no problems setting the voltage drop $V_{BAT}$ correctly (e.g., without the help of the $I_{FLIP}$ current from transistor M8).

Here, the regulation loop comprises sense transistors M1 and M3, the current mirror M9 and M10 which inverts current through M3 to cancel $I_{AC}$, and transistors M5, M6, and M7 which close the loop to regulate the current pull to drop a voltage $V_{BAT}$ across resistor $R_{BAT}$. In some embodiments, when $V_{GSN}=(V_{DD}-V_{SGP})$, there is no current pulled over the resistor $R_{BAT}$ and so $V_{BAT}$ is zero. In some embodiments, the $I_{FLIP}$ current closes the regulator loop and makes it stable.

In the case, of a process corner variance or decrease in supply $V_{DD}$, where the n-type transistor gate source voltage $V_{GSN}$ is above $V_{DD}$ minus the p-type transistor gate source voltage (e.g., $V_{GSN}>(V_{DD}-V_{SGP})$), an additional current $I_{FLIP}$ is provided by transistor M8 which allows the regulation loop to regulate a negative $V_{BAT}$. This $I_{FLIP}$ current from transistor M8 can create a rise in voltage across nodes N2 to N1 relieving the problem if the $V_{BAT}$ needs to flip polarities as described with reference to FIGS. 4A-B. As such, class AB output is achieved at a high speed with low $V_{DD}$ using apparatus 100. The circuit connectivity of various transistors in apparatus 100 reduces complexity of traditional high speed class AB output amplifiers, and further results in improved linearity.

FIG. 2 illustrates a low voltage Class AB output single-side sensing stage 200 of a differential amplifier with trimable current sensing, according to some embodiments of the disclosure. It is pointed out that those elements of FIG. 2 having the same reference numbers (or names) as the elements of any other figure can operate or function in any manner similar to that described, but are not limited to such. So as not to obscure the various embodiments, differences between FIG. 2 and FIG. 1 are discussed. Here, transistor M5 of FIG. 1 is replaced with a tunable n-type transistor M5a. In some embodiments, the tunable transistor M5a is a group of transistors which are coupled together in parallel. In some embodiments, a multi-bus signal (e.g., Trim) is used to adjust the current driving strength of transistor M5a. For example, Trim bus is used to turn on/off transistors in parallel that together form the group of transistors M5a. In some embodiments, the setting of the Trim bits (of the Trim bus) are set at the time of manufacture via fuses or registers. In some embodiments, the Trim bits (of the Trim bus) are dynamically set for different supply $V_{DD}$ voltage levels. In some embodiments, the output stage can also be trimmed (e.g., the transistor sizes can be modulated) when the output load resistance is changing. In some embodiments, the process of trimming is performed dynamically on the fly if the load is changing. In some embodiments, the process of trimming occurs for different operation modes and speeds of the amplifier. For example, by increasing the size of transistors M5a and MNnbias, the amplifier operates faster.

FIG. 3 illustrates a low voltage Class AB output differential amplifier 300, according to some embodiments of the disclosure. It is pointed out that those elements of FIG. 3 having the same reference numbers (or names) as the elements of any other figure can operate or function in any manner similar to that described, but are not limited to such. Amplifier 300 shows the "other side" of FIG. 1 with a common differential input amplifier stage (transistors MNinm, MNinp, MPa, MPb, and MNnbias) and current sensing stage (transistors M5, M6, M7, M9, and M10).

In some embodiments, the "other side" that provides the negative output ($V_{outm}$) comprises n-type transistor M77 which behaves the same as transistor M7, but is coupled to the second battery resistor $R1_{BAT}$. In some embodiments, the "other side" comprises n-type transistors M33 and M44 coupled to node N22, and behave the same as the transistors M3 and M4, respectively. In some embodiments, the "other side" comprises p-type transistors M88 and M22, which behave the same as transistors M8 and M2, respectively.

In some embodiments, amplifier 300 senses an output current $I_{OUT}$ on both sides of the differential outputs $V_{outp}$ and $V_{outm}$ of the amplifiers. For example, amplifier 300 senses an output current $I_{OUT}$ through transistors M4 and M44 within the operational amplifier stage. In some embodiments, amplifier 300 samples the current with $I_{sense}+I_{AC}/A$ and $I_{sense}-I_{AC}/A$ by the matching transistors M3 and M33. The currents are then combine at the drains of transistors M3 and M33 which result in the AC currents being removed and only $2I_{sense}/A$ current being passed to the current mirror transistors M10 and M9. In some embodiments, the current mirror transistors M10 and M9 then invert the $2I_{sense}/A$ current which is then subtracted from the currents in transistors M5/M6 and then mirrored again with transistor M7 which has the ratio of 1:B In some embodiments, when $I_{AC}+$ and $I_{AC}-$ subtraction does not result in zero, a common mode error is produced within the opamps' outputs $V_{outm}$ and $V_{outp}$ which is generally small and rejected by the following stages. Here, the following stage is, for example, an amplifier, analog-to-digital converter (ADC), comparator, etc. which are before the amplifier. In some embodiments, the regulation loop regulates the n-type output only. The regulation loop regulates transistors M4 and M44. In some embodiments, the CMFB loop which produces $V_{CMFB}$ loop is regulated by the p-type output. The CMFB loop in the differential pair input sets the p-type output transistors M2/M22 by the voltage at nodes N1/N11, respectively.

Figure 4A:
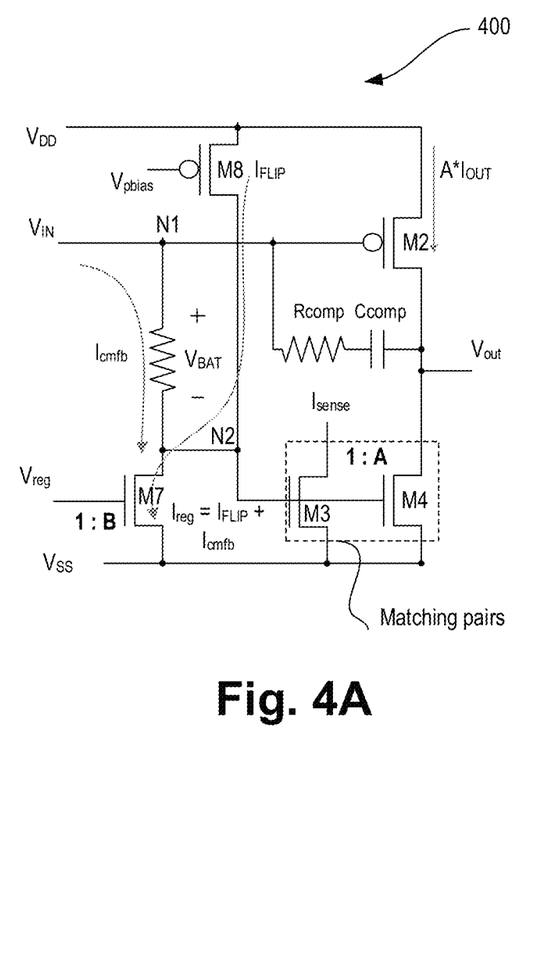
FIG. 4A illustrates a portion of the Class AB output single-side sensing amplifier of FIG. 3 showing current flow when $V_{BAT}$ is positive, according to some embodiments of the disclosure.
Figure 4B:
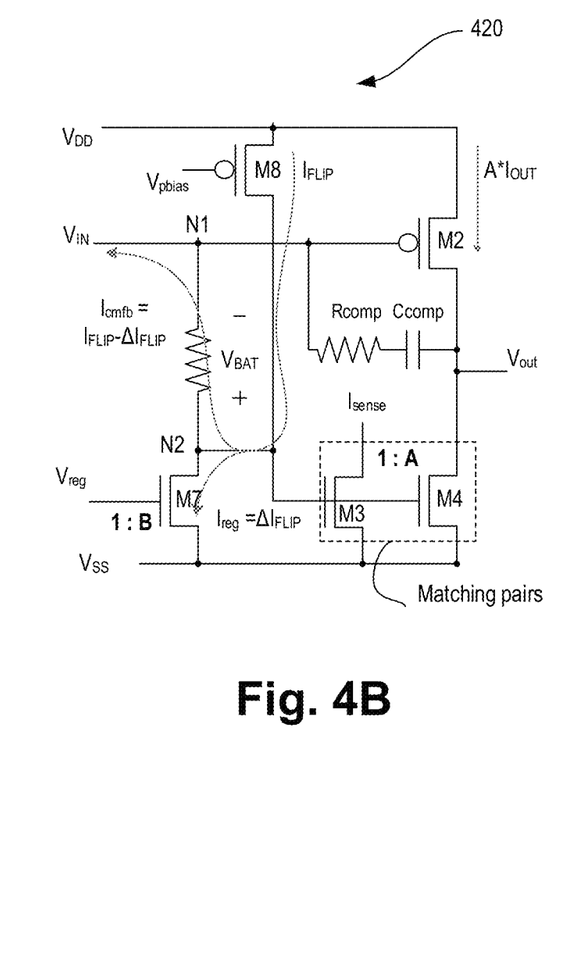
FIG. 4B illustrates a portion of the Class AB output single-side sensing amplifier of FIG. 3 showing current flow when $V_{BAT}$ is negative, according to some embodiments of the disclosure.

FIG. 4A illustrates portion 400 of the Class AB output single-side sensing amplifier of FIG. 3. Portion 400 illustrates the differential sensing with n-type sensing with matched transistors M3/M4 showing current flow when $V_{BAT}$ is positive, according to some embodiments of the disclosure. FIG. 4B illustrates portion 420 of the Class AB output single-side sensing amplifier of FIG. 1 showing current flow when $V_{BAT}$ is negative, according to some embodiments of the disclosure. It is pointed out that those elements of FIGS. 4A-B having the same reference numbers (or names) as the elements of any other figure can operate or function in any manner similar to that described, but are not limited to such. FIGS. 4A-B illustrate how biasing works with positive $V_{BAT}$ and a flipped $V_{BAT}$ in different use cases.

In FIG. 4A, a positive $V_{BAT}$ is shown when the n-type gate voltage $V_{GSN}$ is below the $V_{DD}-V_{SGP}$ of the p-type device. In this case the flip current $I_{FLIP}$ is completely directed to ground and the regulation current is the sum of the $I_{CMFB}$ current provided from the first stage (i.e., the differential input stage) to drop over the resistor $R_{BAT}$ and the $I_{FLIP}$ current. Here, Vin is the output of the differential input pair stage coupled to node N1.

In the case when the $V_{BAT}$ is flipped as in FIG. 4B, the $I_{CMFB}$ sinks the $I_{FLIP}-\Delta I_{FLIP}$ current resulting in a negative $V_{BAT}$ voltage. In order to keep the feedback functional of the class AB biasing, $I_{FLIP}$ is sized so that some current, $\Delta I_{FLIP}$ still flows through $I_{REG}$, in accordance with some embodiments. In some embodiments, when the $V_{BAT}$ polarity flips, this means the $V_{GSN}>V_{DD}-V_{SGP}$.

Figure 5:
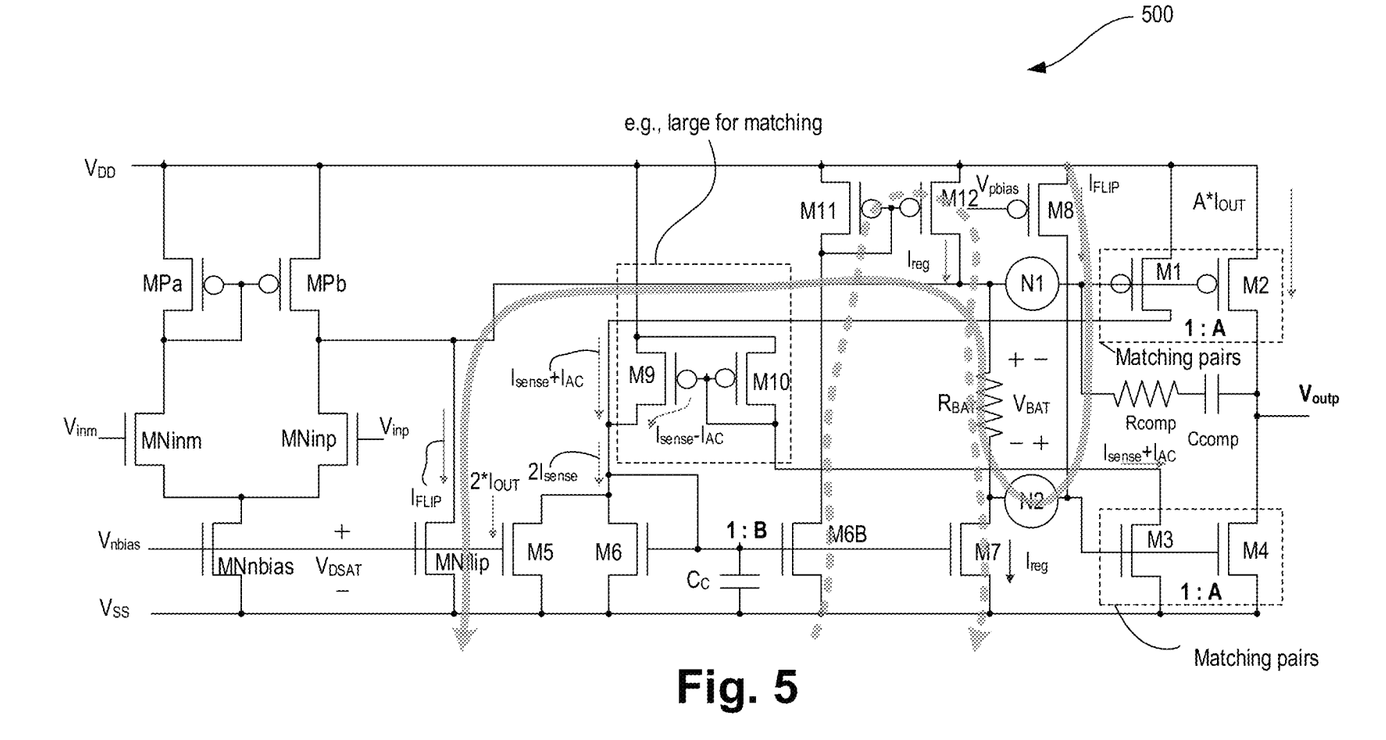
FIG. 5 illustrates a low voltage Class AB output single-side sensing amplifier with systematic offset removal apparatus, according to some embodiments of the disclosure.

FIG. 5 illustrates a low voltage Class AB output single-side sensing amplifier 500 with systematic offset removal apparatus, according to some embodiments of the disclosure. It is pointed out that those elements of FIG. 5 having the same reference numbers (or names) as the elements of any other figure can operate or function in any manner similar to that described, but are not limited to such.

A systematic offset occurs when both inputs of the amplifier are connected to the same voltage (e.g., $V_{DD}/2$). If there is no systematic offset, then the output of the amplifier should be $V_{DD}/2$. If systematic offset is not removed, there may be a mismatch current into node N2 which will lift up N1 and create a small offset of the amplifier. In the differential amplifier, the $V_{CMFB}$ regulates the mismatch current thus this systematic offset is removed.

Compared to amplifier 100 of FIG. 1, here additional transistors are provided which include n-type transistors MNflip and M6B, and p-type transistors M11 and M12. Here, $V_{CMFB}$ is removed because this is a single output amplifier not a differential output one. In some embodiments, transistor MNflip is coupled to node N1 and ground, and biased by $V_{nbias}$. In some embodiments, transistors M11, M12, and M6B together form a current mirror, where transistor M12 mirrors the current through transistors M11 and M6B on to node N1.

Since the differential implementation relies on the $I_{CMFB}$ current sourced or sunk from the differential input stage of amplifier 500, four additional transistors (MNflip, M6B, M11, and M12) are added in amplifier 500 to remove the systematic offset created by the regulator loop, in accordance with some embodiments. The regulator loops are the same those discussed with reference to FIGS. 1-4 for setting the output current, in accordance with some embodiments. Here, the currents injected into node N1 match with the currents removed from node N2 by using the additional transistors. In some embodiments, a path for $I_{FLIP}$ is provided to be pulled from the node N1 so $I_{FLIP}$ from transistor M8 can flow over resistive device $R_{BAT}$, up and then to ground ($V_{SS}$) as shown by the solid gray arrow path. In some embodiments, $I_{reg}$ from transistor M12 is copied into node N1 so $I_{reg}$ can flow over the resistive device $R_{BAT}$ to node N2, thus removing any offset created by $I_{reg}$. This current path is illustrated by the dotted gray arrow path. In some embodiments, the regulation loops create their own current which is pulled over by resistor $R_{BAT}$ (see, for example, dotted gray arrow path).

Figure 6:
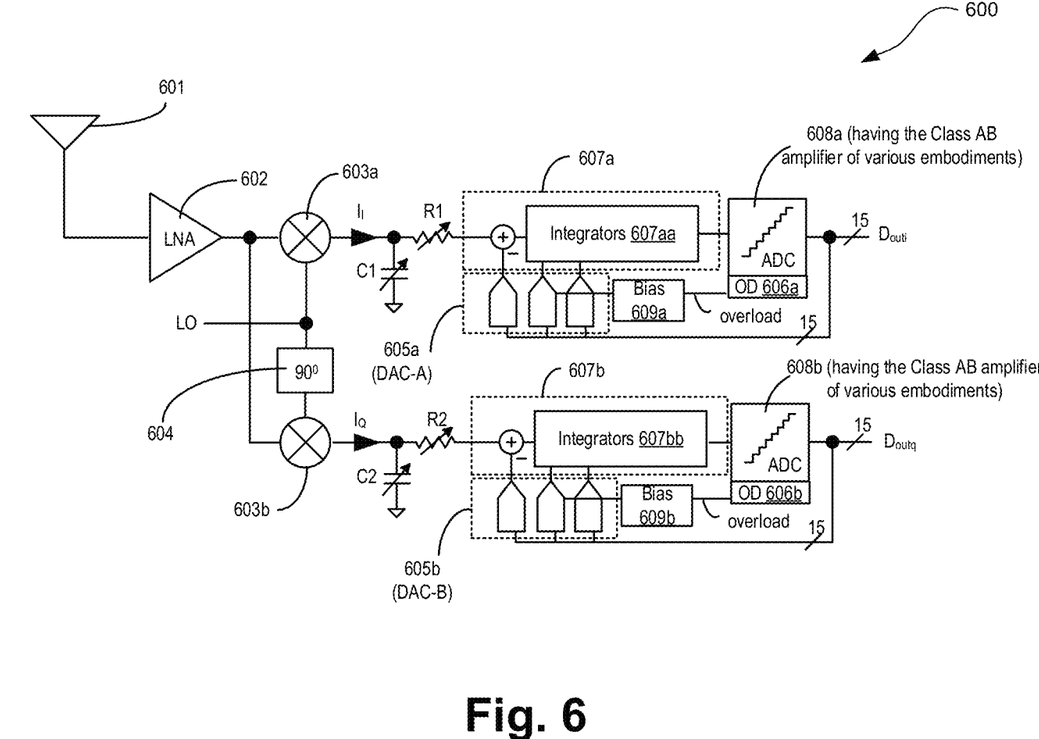
FIG. 6 illustrates a front-end of a radio-frequency (RF) apparatus with a Class AB output amplifier, according to some embodiments of the disclosure.

FIG. 6 illustrates a front-end of a radio-frequency (RF) apparatus 600 with a Class AB output amplifier, according to some embodiments of the disclosure. It is pointed out that those elements of FIG. 6 having the same reference numbers (or names) as the elements of any other figure can operate or function in any manner similar to that described, but are not limited to such.

Apparatus 600 receives an input signal and generates a digital stream as In-phase (I) and Quadrature (Q) signals, $D_{outi}$ and $D_{outq}$, respectively. In this example, the output signals $D_{outi}$ and $D_{outq}$ are 15-bit thermometer coded signals. However, the embodiments are not limited to such. Fewer or more bits may be used for $D_{outi}$ and $D_{outq}$. Here, node names and signal names are interchangeably used. For example, the term "$D_{outi}$" may refer to the In-phase node or signal on that node depending on the context of the sentence.

In some embodiments, apparatus 600 comprises: an Antenna 601, Low Noise Amplifier (LNA) 602, Mixers 603a and 603b, Phase Shifter 604, Low-Pass Filters (R1-C1, and R2-C2), DACs 605a (DAC-A) and 605b (DAC_B), Overload Detectors (OD) 606a and 606b, Loop Filters 607a and 607b, ADCs 608a and 608b, and Bias Generators 609a and 609b.

In some embodiments, Antenna 601 may comprise one or more directional or omnidirectional antennas, including monopole antennas, dipole antennas, loop antennas, patch antennas, microstrip antennas, coplanar wave antennas, or other types of antennas suitable for transmission of Radio Frequency (RF) signals. In some multiple-input multiple-output (MIMO) embodiments, Antenna(s) 601 are separated to take advantage of spatial diversity.

In some embodiments, LNA 602 receives an input from Antenna 601 and converts the weak signal received from Antenna 601 to an amplified output. Any suitable design for LNA that achieves low noise figure (NF) (e.g., NF of 1 dB) and high gain (e.g., 20 dB) can be used for implementing LNA 602.

In some embodiments, Mixers 603a and 603b are switching mixers that receive the output of LNA 602 and mix the frequency of that output by a local oscillator (LO) frequency and its phase shifted version (e.g., phase shifted by Shifter 604). Any suitable mixer design can be used for implementing Mixers 603a and 603b. In some embodiments, the outputs of Mixers 603a and 603b (i.e., $I_I$ and $I_Q$) are filtered by respective filters (R1-C1 and R2-C2).

A DAC is an apparatus that converts digital data (e.g., binary or thermometer coded) into an analog signal (current, voltage, or electric charge). In some embodiments, DACs 605a/b receive a digital code from ADCs 608a/b and provide current to the inputs of Integrators 607aa/bb. In some embodiments, DACs 605a/b are pulse width modulator DACs. In other embodiments, other types of DACs may be used for implementing DACs 605a/b. For example, interpolating DACs (also known as oversampling DACs), binary weighted DACs (e.g., switched resistor DACs, switched capacitor DACs, switched current-source DACs), R-2R ladder DAC, thermometer coded DAC, segmented DAC, etc. may be used for implementing DACs 605a/b. Any suitable DAC may be used for implementing DACs 605a/b.

In some embodiments, Loop Filters 607a/b comprise of integrators 607aa/bb. In some embodiments, the number of integrators 607aa/bb determine the order of the filter and can be built to any order. By adjusting the number of integrators 607aa/bb in Loop Filters 607a/b, different types of transfer functions can be implemented. In various embodiments here, a third order loop low pass filter is presented with no signal transfer peaking. In some embodiments, integrators 607aa/bb are built as active RC (resistor-capacitor) integrators. In other embodiments, other types of implementations may be used for building integrators 607aa/bb.

For example, GM-C integrators, passive RC integrator, etc. can be used for building integrators 607aa/bb. In some embodiments, the feedback mechanism of Loop Filters 607a/b is a feed-forward mechanism. In other embodiments, other types of feedback mechanisms can be used. For example, traditional feedback or a hybrid of the traditional feedback and feed-forward paths can be used for implementing the feedback path Filters 607a/b. In some embodiments, the analog signals (generated by DACs 605a and 605b) are subtracted from the inputs of integrator 607aa/607bb.

ADCs are apparatuses that convert continuous physical quantities (e.g., voltages) to digital numbers that represent the amplitude of the physical quantities. In some embodiments, ADCs 608a/b convert the analog output of Loop Filters 607a/b to their corresponding digital representations. Any suitable ADC may be used to implement ADCs 608a/b. For example, ADC 608a/b is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs 608a/b are considered to be flash ADCs.

In some embodiments, ADCs 608a/b include class AB output amplifiers (e.g., 100, 200, 300, and/or 500) according to various embodiments. In some embodiments, B output amplifiers (e.g., 100, 200, 300, and/or 500) are used within the loop filter of the ADC 608a/b to build the integrators. A loop filter can be of first order or higher order. Each order of the loop filter is an integrator which has a class AB output amplifier, in accordance with some embodiments. For example, a $5^{th}$ order loop filter typically has 5 integrators and five class AB output amplifiers. (Note, it is possible to make a $5^{th}$ order loop filter with merely 3 integrators, where two integrators have second order transfer functions).

In some embodiments, OD 606a/b include logic to detect consecutive cycles of an overload condition at the inputs of ADC 608a/b. For example, OD 606a/b compares two successive input signals to ADC 608a/b, respectively, and determines whether an overload condition exists. When an overload occurs within the integrators 607aa/bb of Loop Filter 607a/b, respectively, the input current into each integrators (of Integrators 607aa/bb) is larger than the feedback current of DACs 605a/b provided to Loop Filters 607a/b. This larger input current results in all integrator outputs diving to power and/or ground supply rails (e.g., Vdd and/or Vss respectively) depending on the input signal. In some embodiments, ODs 606a/b detect at least two consecutive output cycles (i.e., outputs of the integrator feeding ADCs 608a/b) at rail levels (i.e., Vdd/Vss levels) to determine whether an overload condition occurred.

In some embodiments, when an overload condition occurs, the signal "overload" is set to cause Bias Generators 609a/b to increase bias currents for higher order DACs in DACs 605a/b. In some embodiments, Bias Generators 609a/b provide constant bias signals (e.g., bias voltage or bias current) to DACs 605a/b so that DACs 605a/b can provide currents according to the outputs of ADCs 608a/b, respectively. This current is subtracted in Loop Filters 607a/b at the inputs of Integrators 607aa/bb, respectively, in accordance with some embodiments. During the overload condition(s), in some embodiments, Bias Generators 609a/b increase the current provided by the higher order DACs (e.g., $DAC_2$, $DAC_3$, etc.) to cancel out the extra charge built up in the capacitors of the overloaded integrators 607aa/bb. In some embodiments, by increasing the current provided by the higher order DACs, the signal transfer function remains unchanged (i.e., the current provided by the first order DAC (e.g., $DAC_1$) is unchanged).

Figure 7:
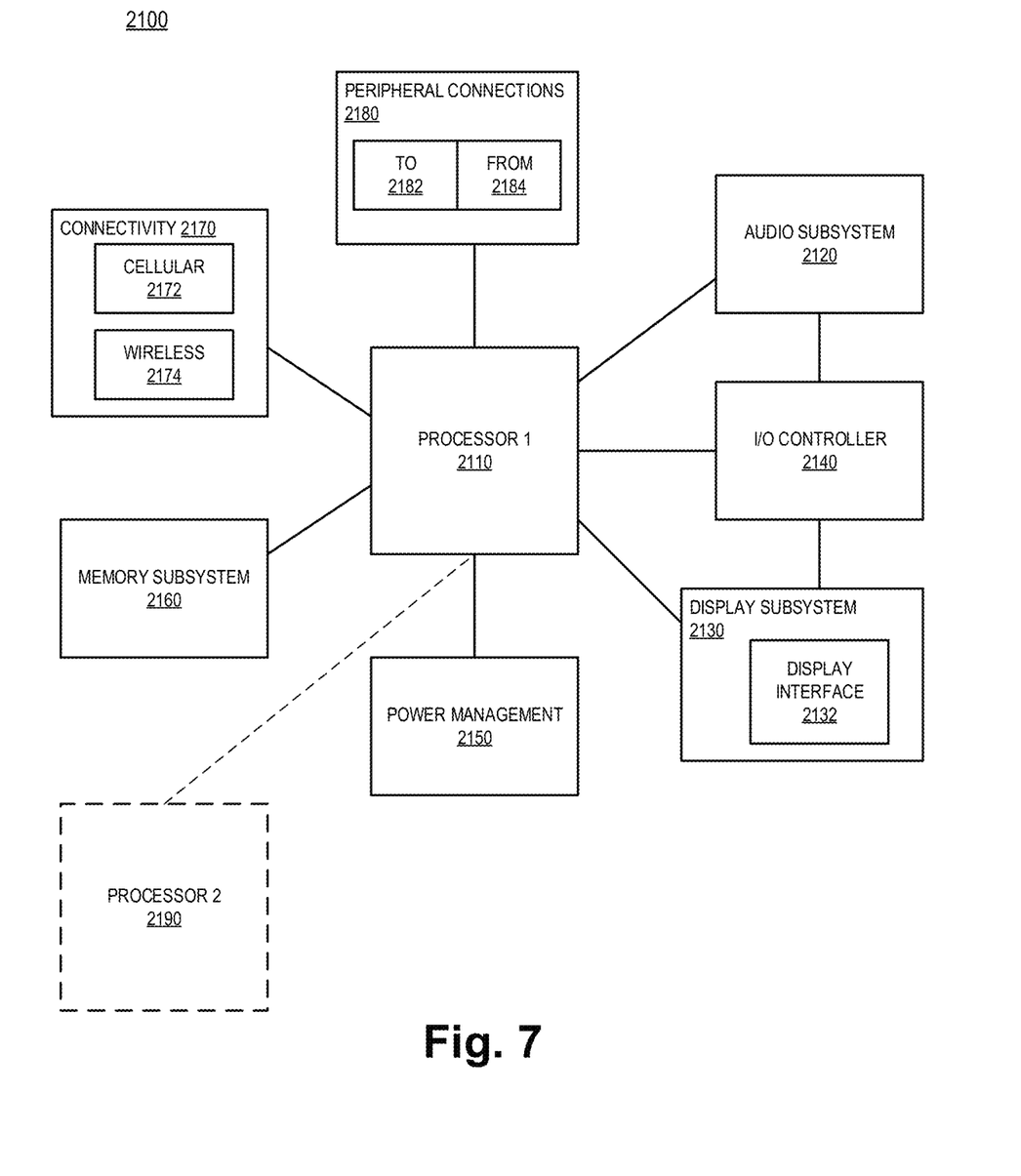
FIG. 7 illustrates a smart device or a computer system or a SoC (System-on-Chip) with a low voltage Class AB output amplifier, according to some embodiments.

FIG. 7 illustrates a smart device or a computer system or a SoC (System-on-Chip) with a low voltage Class AB output amplifier (e.g., 100, 200, 300, and/or 500), according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with a low voltage Class AB output amplifier (e.g., 100, 200, 300, and/or 500), according to some embodiments discussed. Other blocks of the computing device 2100 may also include a low voltage Class AB output amplifier (e.g., 100, 200, 300, and/or 500), according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110. In some embodiments, audio subsystem 2120 includes a sigma-delta modulator based ADC having apparatus to detect and recover from overload.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user. In some embodiments, Display subsystem 2130 includes a sigma-delta modulator based ADC having apparatus to detect and recover from overload.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. Memory subsystem 2160 may include a sigma-delta modulator based ADC having apparatus to detect and recover from overload, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication. In some embodiments, Cellular connectivity 2172 includes the apparatus to improve linearity of a DAC. For example, Cellular connectivity 2172 includes the front-end RF receiver of FIG. 6 with a low voltage Class AB output amplifier (e.g., 100, 200, 300, and/or 500).

Referring back to FIG. 7, in some embodiments, Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a differential input amplifying stage including a current source and a first node; a first matched pair of transistors coupled to the first node, wherein one of the transistors of the first matched pair is coupled to an output node of a driving stage; a second matched pair of transistors coupled to a second node to bias the second matched pair of transistors, wherein one of the transistors of the second matched pair of transistors is coupled to the output node of the driving stage, and wherein the second node is to be charged according to a first bias of the current source; and a resistive device coupled to the first and second nodes.

In some embodiments, the apparatus comprises a bias transistor coupled to a supply terminal and the second node, wherein the bias transistor is biased according to a second bias different from the first bias. In some embodiments, another transistor of the first matched pair of transistors is coupled to the first node. In some embodiments, the apparatus comprises: a capacitor coupled to the output node of the driving stage; and a resistor coupled in series with the capacitor, the resistor also coupled to the first node. In some embodiments, the apparatus comprises a current mirror coupled to the second node, wherein the current mirror includes: a diode connected transistor; and a multiplying transistor, wherein the multiplying transistor is coupled to the second node.

In some embodiments, the apparatus comprises a transistor coupled in parallel to the diode connected transistor, wherein the transistor has a gate terminal which is biased according to the first bias of the current source of the differential input amplifying stage. In some embodiments, a drive strength of the transistor is trim-able. In some embodiments, the apparatus comprises a third pair of matching transistors including: a first transistor coupled to the diode connected transistor of the current mirror; and a second transistor which is diode connected and coupled to another transistor of the second matched pair of transistors.

In another example, a system is provided which comprises: a memory, a processor coupled to the memory, and a wireless interface for allowing the processor to communicate with another device, wherein the processor includes an apparatus according to the apparatus described above.

In another example, an apparatus is provided which comprises: an amplifier operable to provide class AB output, wherein the amplifier includes: a differential amplifier stage having a stack of three transistors including a current source between a supply node and a ground node; and a current sensor coupled to a driving stage, together coupled to the differential amplifier stage, wherein the current sensor and the driving stage have no more than two transistors in a stack between the supply node and the ground node. In some embodiments, the driving stage includes: a first matched pair of transistors coupled to a first node of the differential amplifier stage, wherein one of the transistors of the first matched pair is coupled to an output node of the driving stage; and a second matched pair of transistors coupled to a second node to bias the second matched pair of transistors, wherein one of the transistors of the second matched pair of transistors is coupled to the output node of the driving stage, and wherein the second node is to be charged according to a first bias of the current source.

In some embodiments, the apparatus comprises a resistive device coupled to the first and second nodes. In some embodiments, the current sensor includes a current mirror which is coupled to the second node, and wherein the current mirror includes: a diode connected transistor; and a multiplying transistor, wherein the multiplying transistor is coupled to the second node. In some embodiments, the apparatus comprises a transistor coupled in parallel to the diode connected transistor, wherein the transistor has a gate terminal which is biased according to the first bias of the current source of the differential input amplifying stage. In some embodiments, a drive strength of the transistor is trim-able.

In another example, a system is provided which comprises: a memory, a processor coupled to the memory, and a wireless interface for allowing the processor to communicate with another device, wherein the processor includes an apparatus according to the apparatus described above.

In another example, a system is provided which comprises: an antenna; an integrated circuit (IC) coupled to the antenna, the IC including a sigma-delta modulator comprising: a loop filter having at least two integrators; and an analog-to-digital converter (ADC) to quantize an output of the loop filter into a digital representation, the ADC including an amplifier having a class AB output, wherein the amplifier includes: a differential input amplifying stage including a current source and a first node; a first matched pair of transistors coupled to the first node, wherein one of the transistors of the first matched pair is coupled to an output node of a driving stage; a second matched pair of transistors coupled to a second node to bias the second matched pair of transistors, wherein one of the transistors of the second matched pair of transistors is coupled to the output node of the driving stage, and wherein the second node is to be charged according to a first bias of the current source; and a resistive device coupled to the first and second nodes; and a processor coupled to the IC.

In some embodiments, the amplifier comprises a bias transistor coupled to a supply terminal and the second node, wherein the bias transistor is biased according to a second bias different from the first bias. In some embodiments, another transistor of the first matched pair of transistors is coupled to the first node. In some embodiments, the amplifier includes a current mirror coupled to the second node, wherein the current mirror includes: a diode connected transistor; and a multiplying transistor, wherein the multiplying transistor is coupled to the second node. In some embodiments, the amplifier includes a transistor coupled in parallel to the diode connected transistor, wherein the transistor has a gate terminal which is biased according to the first bias of the current source of the differential input amplifying stage.

In some embodiments, the ADC includes a detection circuit which comprises logic to detect at least two cycles of an overload condition in the output of the loop filter, and wherein the logic is to generate an indicator indicating whether the overload condition is detected. In some embodiments, the sigma-delta modulator comprises at least two digital-to-analog converters (DACs), wherein at least one of the DACs is to receive a bias independent of the output of the detection circuit, and wherein at least one of the DACs is to receive a bias dependent on the output of the detection circuit. In some embodiments, the amplifier comprises a transistor coupled in parallel to the diode connected transistor, wherein the transistor has a gate terminal which is biased according to the first bias of the current source of the differential input amplifying stage. In some embodiments, a drive strength of the transistor is trim-able. In some embodiments, the apparatus comprises a third pair of matching transistors including: a first transistor coupled to the diode connected transistor of the current mirror; and a second transistor which is diode connected and coupled to another transistor of the second matched pair of transistors.

In another example, a system is provided which comprises: an antenna; an integrated circuit (IC) coupled to the antenna, the IC including a sigma-delta modulator comprising: a loop filter having at least two integrators; and an analog-to-digital converter (ADC) to quantize an output of the loop filter into a digital representation, the ADC including an amplifier having a class AB output, wherein the amplifier is to provide class AB output, and wherein the amplifier includes: a differential amplifier stage having a stack of three transistors including a current source between a supply node and a ground node; and a current sensor coupled to a driving stage, together coupled to the differential amplifier stage, wherein the current sensor and the driving stage have no more than two transistors in a stack between the supply node and the ground node.

In some embodiments, the ADC includes a detection circuit which comprises logic to detect at least two cycles of an overload condition in the output of the loop filter, and wherein the logic is to generate an indicator indicating whether the overload condition is detected. In some embodiments, the sigma-delta modulator comprises at least two digital-to-analog converters (DACs), wherein at least one of the DACs is to receive a bias independent of the output of the detection circuit, and wherein at least one of the DACs is to receive a bias dependent on the output of the detection circuit. In some embodiments, the driving stage includes: a first matched pair of transistors coupled to a first node of the differential amplifier stage, wherein one of the transistors of the first matched pair is coupled to an output node of the driving stage; and a second matched pair of transistors coupled to a second node to bias the second matched pair of transistors, wherein one of the transistors of the second matched pair of transistors is coupled to the output node of the driving stage, and wherein the second node is to be charged according to a first bias of the current source.

In some embodiments, the amplifier comprises a resistive device coupled to the first and second nodes. In some embodiments, the current sensor includes a current mirror which is coupled to the second node, and wherein the current mirror includes: a diode connected transistor; and a multiplying transistor, wherein the multiplying transistor is coupled to the second node. In some embodiments, the amplifier comprises a transistor coupled in parallel to the diode connected transistor, wherein the transistor has a gate terminal which is biased according to the first bias of the current source of the differential input amplifying stage. In some embodiments, a drive strength of the transistor is trim-able.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   an integrator;
   an analog-to-digital converter (ADC) coupled to an output of the integrator, wherein the ADC comprises a class AB amplifier having class AB biasing, wherein the AB amplifier comprises a differential amplifier stage and a current sense circuitry coupled to the differential amplifier stage; and a digital-to-analog converter (DAC) coupled to the ADC and the integrator, wherein the differential amplifier stage comprises a differential input amplifier having n-type devices, and wherein the current sensing circuitry is to regulate an output quiescent current of the n-type devices.

2. The apparatus of claim 1 comprises a filter coupled to an input of the integrator.

3. The apparatus of claim 2 comprises a mixer coupled to the filter.

4. The apparatus of claim 3 comprises a low-noise-amplifier (LNA) coupled to the mixer.

5. The apparatus of claim 4 comprises an antenna coupled to an input of the LNA.

6. The apparatus of claim 1, wherein the class AB amplifier comprises a resistor or a resistive device to level-shift an AC signal from an output of the differential input amplifier.

7. The apparatus of claim 1, wherein the class AB amplifier comprises p-type devices for its output stage.

8. The apparatus of claim 7 comprises a common mode feedback loop to regulate quiescent current of the p-type devices.

9. The apparatus of claim 1, wherein the differential amplifier stage includes a stack of three transistors including a current source between a supply node and a ground node.

10. The apparatus of claim 9, wherein the class AB amplifier comprises: a current sensor coupled to a driving stage, together coupled to the differential amplifier stage, and wherein the current sensor and the driving stage have no more than two transistors in a stack between the supply node and the ground node.

11. A system apparatus comprising:
an antenna;
an integrated circuit (IC) coupled to the antenna, wherein the IC includes:
a first integrator;
a first analog-to-digital converter (ADC) coupled to an output of the first integrator, wherein the first ADC comprises a class AB amplifier having class AB biasing, wherein the AB amplifier comprises a differential amplifier stage and a current sense circuitry coupled to the differential amplifier stage; and
a first digital-to-analog converter (DAC) coupled to the first ADC and the first integrator;
a second integrator;
a second ADC coupled to an output of the second integrator, wherein the second ADC comprises a class AB amplifier having class AB biasing; and
a second DAC coupled to the second ADC and the second integrator; and
a memory coupled to the IC.

12. The system of claim 11, wherein the IC comprises:
a first filter coupled to an input of the first integrator; and
a second filter coupled to an input of the second integrator.

13. The system of claim 12, wherein the IC comprises:
a first mixer coupled to the first filter; and
a second mixer coupled to the second filter, wherein the first mixer is to receive a first local oscillation signal, and wherein the second mixer is to receive a second local oscillation signal which is phase-shifted relative to the first local oscillating signal.

14. The system of claim 13, wherein the IC comprises a low-noise amplifier (LNA) coupled to the first and second mixers, and coupled to the antenna.

15. The system of claim 11, wherein the differential amplifier stage comprises a differential input amplifier including n-type devices, wherein the current sensing circuitry is to regulate an output quiescent current of the n-type devices; and wherein the class AB amplifiers comprises:
a resistor or resistive device to level-shift an AC signal from an output of the differential input amplifier.

16. An apparatus comprising:
a differential input amplifier including a current source and a first node;
a matched pair of devices coupled to the first node, wherein one of the devices of the matched pair is coupled to an output node of a driving circuitry; and
a resistive device coupled to the first node.

17. The apparatus of claim 16, wherein the matched pair is a first matched pair, and wherein apparatus comprises:
a second matched pair of device coupled to a second node to bias the second matched pair of devices, wherein one of the devices of the second matched pair of devices is coupled to the output node of the driving circuitry.

18. The apparatus of claim 17, wherein the second node is to be charged according to a first bias of the current source, and wherein the resistive device is coupled to the second node.

* * * * *